United States Patent

Eguchi et al.

[11] Patent Number: 5,712,507
[45] Date of Patent: Jan. 27, 1998

[54] SEMICONDUCTOR DEVICE MOUNTED ON DIE PAD HAVING CENTRAL SLIT PATTERN AND PERIPHERAL SLIT PATTERN FOR ABSORBING

[75] Inventors: Takahiro Eguchi; Yasuhiro Suzuki, both of Tokyo, Japan

[73] Assignee: NEC Corporation, Japan

[21] Appl. No.: 589,784

[22] Filed: Jan. 22, 1996

[30] Foreign Application Priority Data

Jan. 25, 1995 [JP] Japan .................... 7-009822
[51] Int. Cl.⁶ .................................. H01L 23/495
[52] U.S. Cl. ................. 257/666; 257/669; 257/676
[58] Field of Search ............................. 257/666, 669, 257/672, 674, 676

[56] References Cited

U.S. PATENT DOCUMENTS 4,797,726  1/1989  Manabe ..................... 257/669
4,918,511  4/1990  Brown ...................... 257/669

FOREIGN PATENT DOCUMENTS 5-114688  5/1993  Japan .

Primary Examiner—Tom Thomas
Assistant Examiner—Roy Potter

[57] ABSTRACT

A plurality of slits are formed in a die pad of a lead-frame for mounting a semiconductor chip, and are arranged in such a manner as to nearly equalize the length of peripheral sub-areas of the die pad uncovered with the semiconductor chip, thereby effectively absorbing a shrinkage and an elongation due to a difference in thermal expansion coefficient among the die pad, the semiconductor chip and a plastic package hermetically sealing the semiconductor chip.

9 Claims, 6 Drawing Sheets

SEMICONDUCTOR DEVICE MOUNTED ON DIE PAD HAVING CENTRAL SLIT PATTERN AND PERIPHERAL SLIT PATTERN FOR ABSORBING

FIELD OF THE INVENTION

This invention relates to a semiconductor device and, more particularly, to a semiconductor device sealed in a package and free from cracks due to thermal stress among a semiconductor chip, a lead-frame and a package.

DESCRIPTION OF THE RELATED ART

A semiconductor chip is sealed in a package for protecting the semiconductor chip against contaminants, undesirable external force and so forth, and various packages have been developed for the semiconductor device. However, a quad-flat-package is appropriate for a large number of signal pins, and the assembling work is easier than that on the other packages.

A system designer has requested a small geometry semiconductor device, and the plastic package is, by way of example, getting thinner and thinner. However, cracks tend to take place in the thin plastic package due to thermal stress.

In detail, the semiconductor devices are subjected to various tests before delivery from the factory, and a heat cycle is repeatedly applied to the semiconductor devices. Assuming now that a silicon chip 1 is bonded on a lead-frame 2 of copper alloy and hermetically sealed in a plastic package 3 as shown in FIG. 1, the copper alloy is about $11.3 \times 10^{-6}/°$ C. in thermal expansion coefficient, and is 4.7 times larger in thermal expansion coefficient than the silicon of $2.4 \times 10^{-6}/°$ C. In the heat cycle, the semiconductor device is cooled at −65 degrees in centigrade, i.e., stage 1, and is heated to 150 degrees in centigrade, i.e., stage 2. While the semiconductor device is at room temperature, the semiconductor device is slightly warped as shown in stage 3. However, the difference in thermal expansion coefficient causes the semiconductor device to be widely warped in stage 1 and to become flat in stage 2. If the lead-frame is formed of nickel alloy such as 42—Ni—Fe alloy, the thermal expansion coefficient of the nickel alloy is $2.4 \times 10^{-6}/°$ C., and the difference from the silicon becomes smaller. However, the thermal expansion coefficient is still 3.3 times larger than that of the silicon.

While the semiconductor device is being subjected to the heat cycle test, the die pad of the lead-frame repeats the shrinkage and the elongation between −8.6 microns and 20 microns at the periphery thereof due to the difference in thermal expansion coefficient. However, the silicon chip 1 is fixed to the die pad of the lead-frame, and the silicon chip 1 on the die pad is hermetically sealed in the plastic package 3. For this reason, the silicon chip 1 tends to peel from the tub, and cracks take place in the plastic package 3.

If the plastic package is thick, the cracks can not reach the semiconductor chip 1. However, the thin plastic package allows the cracks to reach the semiconductor chip 1, and water and contaminants damage the integrated circuit fabricated on the silicon chip 1.

Japanese Patent Publication of Unexamined Application No. 5-114688 discloses a lead-frame taking up the thermal stress. FIG. 2 illustrates the die pad of the lead-frame disclosed in the Japanese Patent Publication of Unexamined Application, and reference numeral 4 designates the die pad forming a part of a lead-frame. Two pairs of slits 4a/4b and 4c/4d are formed in the central area of the die pad 4 in perpendicular to each other, and are open to both of the upper and lower surfaces of the die pad 4.

The slits 4a and 4b are in parallel to one another, and are slightly staggered. The other slits 4c and 4d are also in parallel to one another, and are slightly staggered. As a result, an island 4e is defined by the two pairs of slits 4a/4b and 4c/4d. Adhesion compound bonds a semiconductor chip (not shown) to the island 4e. A frame-shaped peripheral area 4f surrounds the island 4e, and the slits 4a to 4d partially penetrate into the frame-like peripheral area 4f.

The die pad 4 further has slits 4g, 4h, 4i and 4j projecting from the side edges into the peripheral area 4f. However, the slits 4g to 4j do not reach the slits 4a to 4d, and the slits 4a to 4d and the slits 4g to 4j divide the peripheral areas 4f into peripheral sub-areas 4fa to 4fh merged with one another.

An arbitrary line between the opposed two edges or a diagonal line crosses at least one of the slits 4a to 4d and 4g to 4j. For this reason, even if a thermal stress is exerted on the die pad 4 in any direction, the at least one slit takes up the elongation, and decreases the thermal stress.

A silicon chip (not shown) is bonded to the die pad 4 of the lead-frame, and the silicon chip bonded to the lead-frame is hermetically sealed in a thin plastic package. However, when the prior art semiconductor device is subjected to the heat cycle test, cracks still take place in the thin plastic package, and the cracks reach the semiconductor chip through the thin plastic package.

SUMMARY OF THE INVENTION

It is therefore an important object of the present invention to provide a semiconductor device which is free from cracks due to a thermal stress.

The present inventors contemplated the problem inherent in the prior art semiconductor device using the tub shown in FIG. 2, and noticed that the peripheral area 4f had not been evenly divided. For example, the peripheral sub-area 4fa was merged with the peripheral sub-area 4fb, and the slit 4g divided the part of the peripheral area along the side edge 4k into 2:1. Although the slits 4a and 4g evenly divided the part of the peripheral area along line X—X, the slit 4a did not reach line Y—Y, and the shrinkage and the elongation along line Y—Y was larger than those along line X—X, and the large shrinkage and the large elongation cracked the thin plastic package.

To accomplish the object, the present invention proposes to evenly divide the peripheral area.

In accordance with the present invention, there is provided a semiconductor device comprising: a semiconductor chip having an electric circuit; a supporting means including a tub having a major surface defined by peripheral edges and mounting the semiconductor chip, a first slit pattern open to the major surface and a reverse surface of the tub and formed in the major surface so as to divide the major surface into a central area and a peripheral area, the semiconductor chip occupying the central area and an inner peripheral sub-area of the peripheral area, and a plurality of slit groups each having a plurality of slits inwardly projecting from one of the peripheral edges through the outer peripheral sub-area into the inner peripheral sub-area so as to divide a part of the outer peripheral sub-area along the aforesaid one of the peripheral edges into a plurality of sections, the first slit pattern and the plurality of slit groups at least twice intercepting a force in a direction of a straight line between two of the peripheral edges opposite to each other and a force in a direction of a diagonal line on the major surface; and a sealing means provided around the semiconductor chip mounted on the tub for preventing the semiconductor chip from contaminants.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

Figure 3:
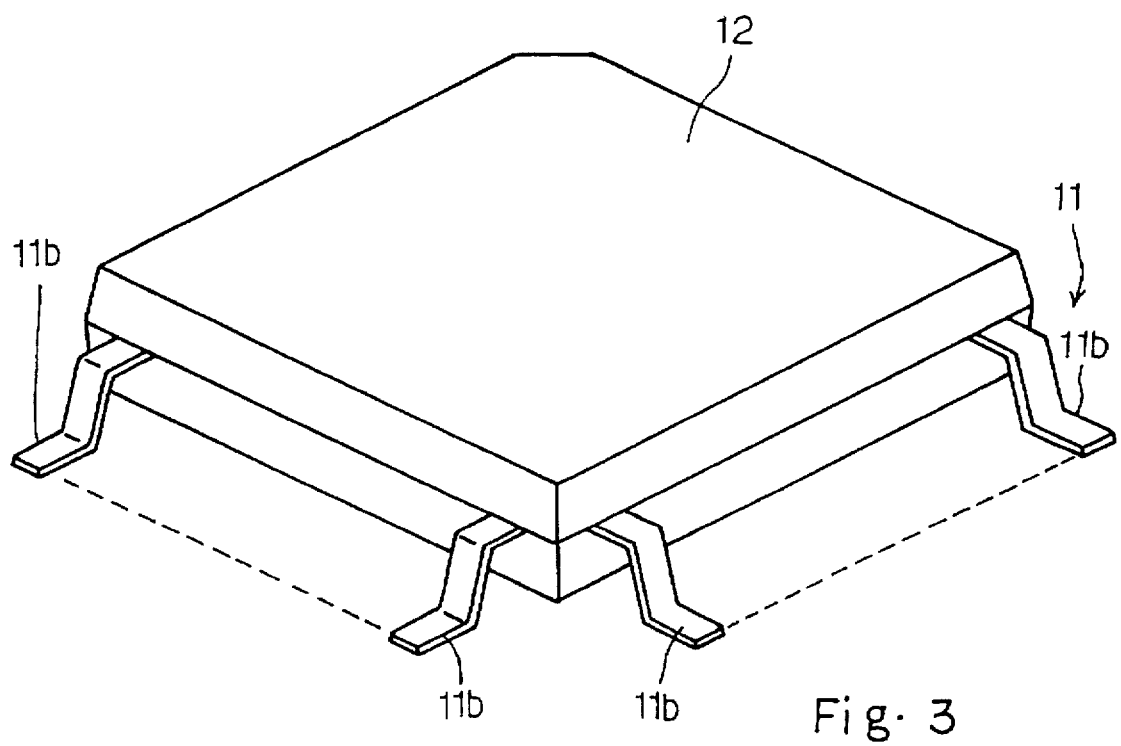
FIG. 3 is a perspective view showing a semiconductor device according to the present invention.
Figure 4:
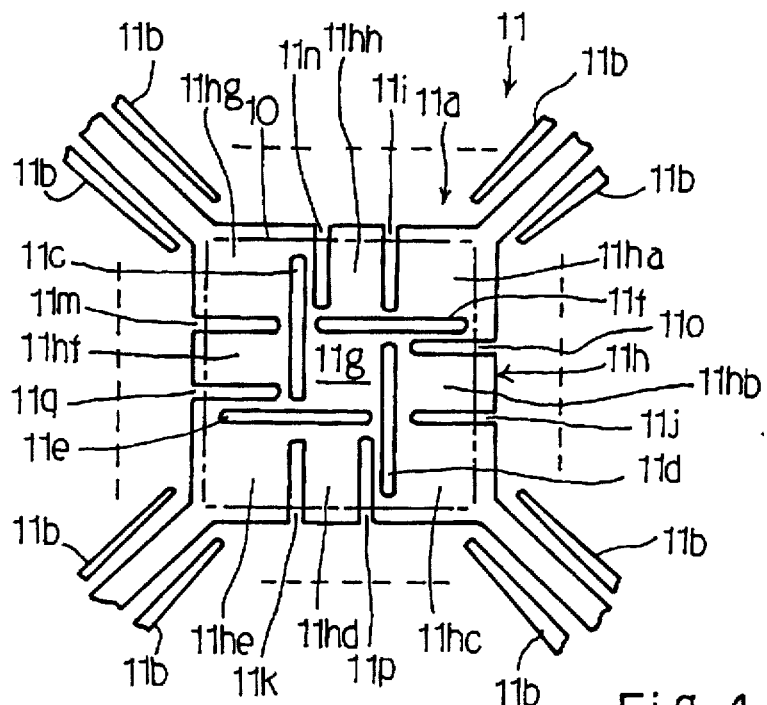
FIG. 4 is a plan view showing a die pad of a lead-frame incorporated in the semiconductor device.

Referring first to FIGS. 3 and 4 of the drawings, a semiconductor device embodying the present invention largely comprises a semiconductor chip 10, a lead-frame 11 and a plastic package 12. An integrated circuit is fabricated on the semiconductor chip 10, and the lead-frame 11 includes a rectangular die pad 11a and leads 11b. The semiconductor chip 10 is bonded to the rectangular die pad 11a, and the leads 11b are connected through conductive wires (not shown) to electrodes of the semiconductor chip 10. The semiconductor chip 10 on the rectangular die pad 11a is hermetically sealed in the plastic package 12, and the leads 11b project from the plastic package 12.

Two pairs of slits 11c/11d and 11e/11f are formed in the rectangular die pad 11a. The slits 11c to 11f pass through the rectangular die pad 11a in the direction of thickness, and are open to the upper and lower surfaces of the rectangular die pad 11a. The slits 11c and 11d are perpendicular to the slits 11e and 11f, and the slits 11c and 11e are slightly staggered to the other slits 11d and 11f, respectively. As a result, a central island 11g is defined by the two pairs of slits 11c/11d and 11e/11f, and a peripheral area 11h is connected to the central island 11g through narrow lug portions between the slits 11c to 11f.

Slits 11i to 11m are further formed in the peripheral area 11h of the rectangular die pad 11a, and inwardly project from the four peripheral edges. The slits 11i to 11m are open to the upper and lower surfaces of the rectangular die pad 11a as similar to the slits 11c to 11f, and are confronted to the slits 11d, 11e, 11c and 11f across the slits 11f, 11d, 11e and 11c, respectively. However, the slits 11i to 11m do not reach the slits 11f, 11d, 11e and 11c.

Slits 11n, 11o, 11p and 11q are further formed in the peripheral area 11h, and inwardly project from the four peripheral edges. The slits 11n to 11q are in parallel to the slits 11i to 11m, respectively, and do not reach the slits 11f, 11d, 11e ad 11c. The slits 11i to 11m and 11n to 11q divide the peripheral area 11h into peripheral sub-areas 11ha to 11hh, and adjacent peripheral sub-areas are connected through lug portions formed between the slits 11i to 11q and the slits 11c to 11f. The slits 11i to 11m and 11n to 11q are arranged in such a manner as to nearly equalize the lengths of the peripheral sub-areas 11ha to 11hh along a straight line between two of the peripheral edges such as line X—X or Y—Y in FIG. 2 or a diagonal line.

It is not necessary to strictly equalize the lengths of the peripheral sub-areas 11ha to 11hh. However, the additional slits 11n to 11q are expected to equalize the shrinkage and the elongation in the heat cycle test. In other words, even if adjacent peripheral sub-areas are different in length, cracks do not take place in so far as the pair of slits 11i/11n, 11j/11o/11k/11p or 11m/11q takes up the total shrinkage/elongation along one of the peripheral edges during the heat cycle.

The peripheral sub-areas 11ha to 11hh as a whole constitute a peripheral island, and the adhesive compound bonds to the semiconductor chip 10 to the central and peripheral islands. Although the slits 11n to 11q decreases the area of the peripheral island, the total area of central and peripheral islands is wide enough to fix the semiconductor chip 10 to the rectangular die pad 11a. If the slits 11i to 11m are spaced from the slits 11n to 11q, the effective area of the peripheral island is increased, and the semiconductor chip 10 is surely fixed to the rectangular tub 11a.

In this instance, the slits 11c to 11f as a whole constitute a first slit pattern, and the slits 11i/11n, the slits 11j/11o, the slits 11k/11p and the slits 11m/11q form a plurality of slit groups.

Upon completion of the packaging, the semiconductor device is subjected to the heat cycle test, and the semiconductor chip 10, the die pad 11a and the plastic package 12 are differently shrunk and expanded due to the different thermal expansion coefficients. However, the slits 11i to 11m and 11n to 11q take up the shrinkage and the elongation. Especially, the slits 11c/11n/11f, 11f/11o/11d, 11d/11p/11e and 11e/11q/11c define crank-shaped connecting areas, and the crank-shaped connecting areas effectively take up the thermal stress by deforming themselves. As a result, the semiconductor chip 10 does not peel off, and the plastic package 12 is not cracked.

Second Embodiment

Figure 6:
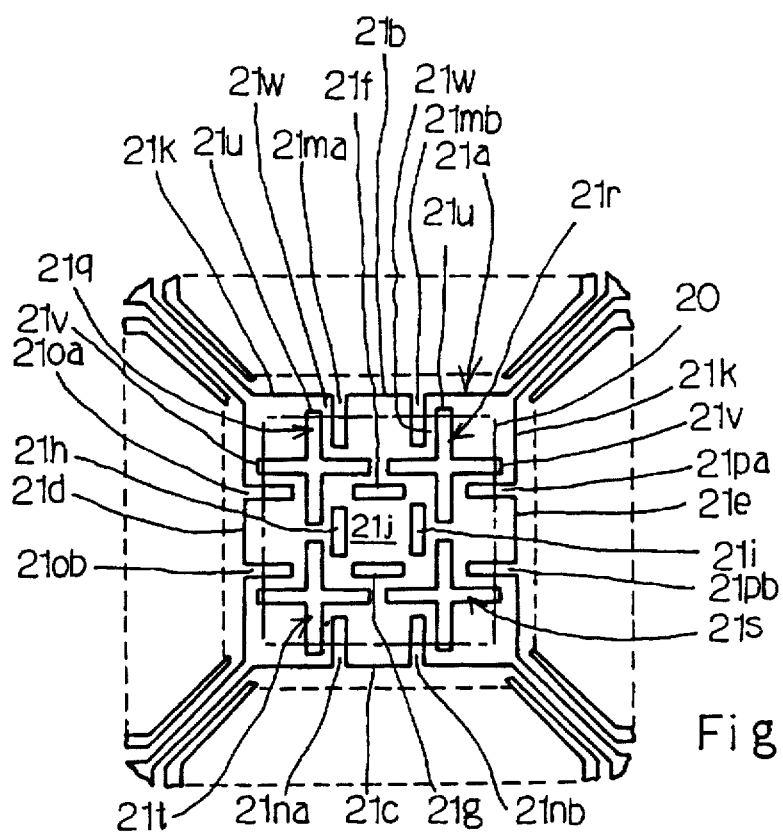
FIG. 6 is a plan view showing a die pad incorporated in the lead-frame.
Figure 5:
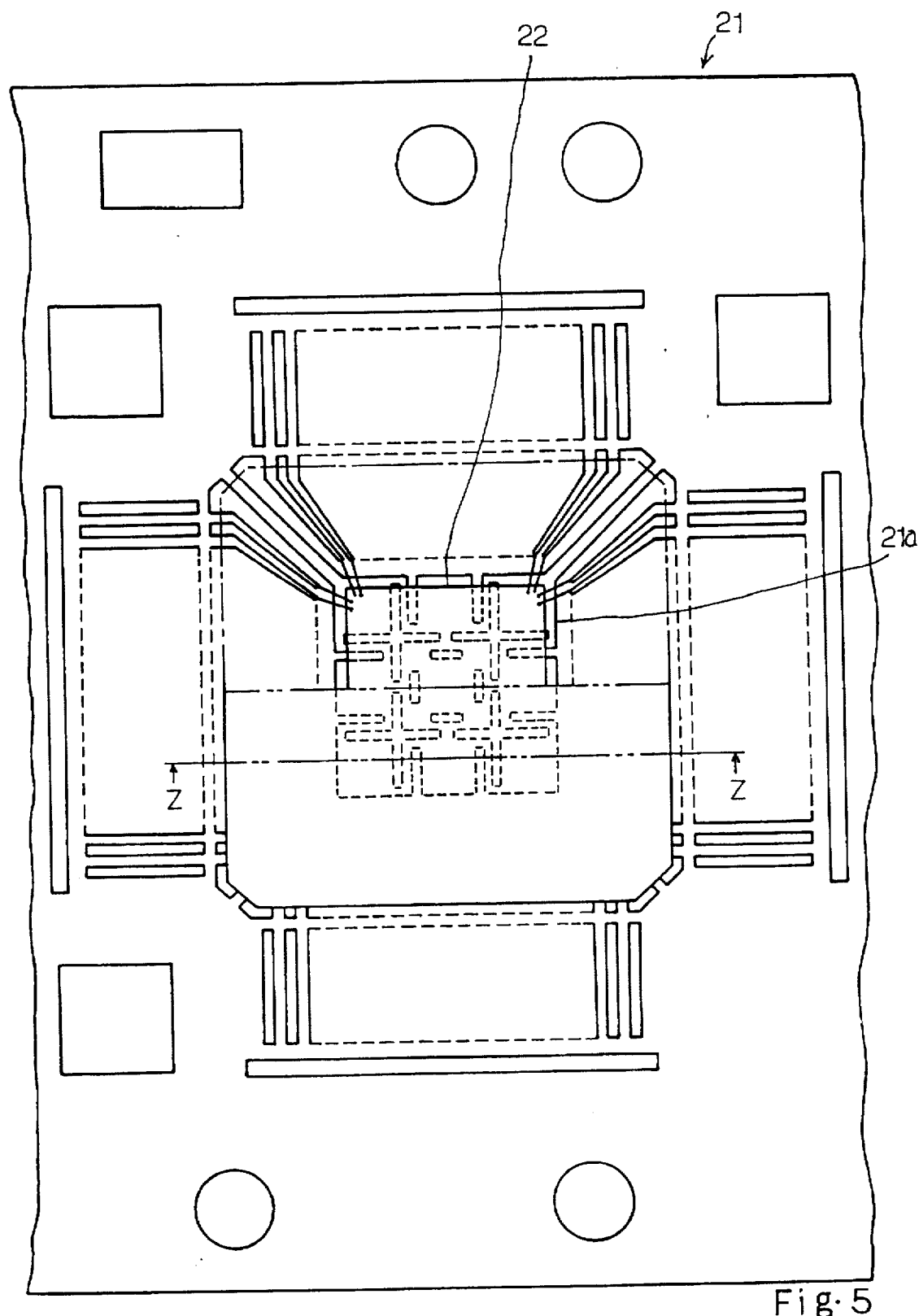
FIG. 5 is a plan view showing a lead-frame and a semiconductor chip incorporated in another semiconductor device according to the present invention.
Figure 7:
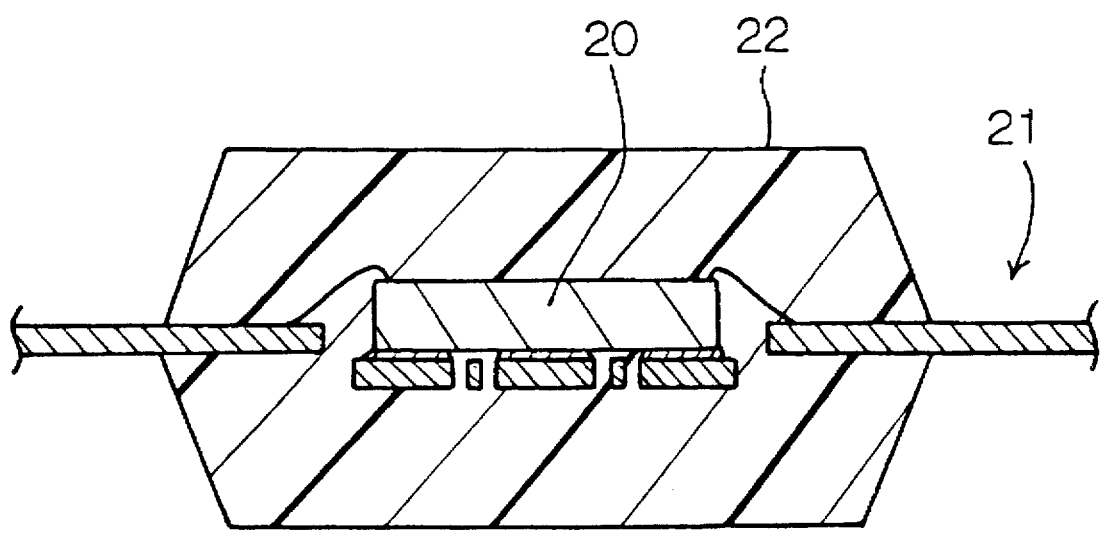
FIG. 7 is a cross sectional view taken along line Z—Z of FIG. 5 and showing the structure of the semiconductor device.

Turning to FIGS. 5 to 7 of the drawings, another semiconductor device embodying the present invention largely comprises a semiconductor chip 20, a lead-frame 21 and a plastic package 22. The semiconductor chip 20 and the plastic package 22 are similar to those of the first embodiment, and the lead-frame 21 is only different in slit pattern from the lead-frame 21. For this reason, description is hereinbelow focused on the die pad 21a.

The die pad 21a has a rectangular configuration, and four peripheral edges 21b, 21c, 21d and 21e define the rectangular configuration. Two pairs of slits 21f/21g and 21h/21i are formed in perpendicular to each other, and the slits 21f and 21h are spaced in parallel to the other slits 21g and 21i. As a result, a rectangular central area 21j is defined by the two pairs of slits 21f/21g and 21h/21i, and is connected to a peripheral area 21k at the four corners thereof. Thus, the two pairs of slits 21f/21g and 21h/21i separates the central area 21j from the peripheral area 21k, and as a whole constitute a first slit pattern.

The semiconductor chip 20 occupies the central area 21j and an inner portion of the peripheral area 21k, and an outer portion of the peripheral area 21k is uncovered with the semiconductor chip 20. The inner portion and the outer portion are "inner peripheral sub-area" and "outer peripheral sub-area", respectively.

Four slit groups 21ma/21mb, 21na/21nb, 21oa/21ob and 21pa/21pb are further formed in the die pad 21a, and respectively project from the peripheral edges 21b to 21e through the outer peripheral sub-area into the inner peripheral sub-area.

Four cross-shaped slits 21q, 21r, 21s and 21t are further formed in the peripheral area 21k, and are respectively located outside of the four corners of the central area 21j. The cross-shaped slit 21q and 21r have respective first slits 21u perpendicular to the peripheral edge 21b and respective second slits 21v crossing the first slits 21u and in parallel to the peripheral edge 21b. The second slits 21v serve as the first slits with respect to the peripheral edges 21d and 21e.

Considering the cross-shaped slits 21q and 21r with respect to the peripheral edge 21b, the slits 21ma and 21mb are spaced in parallel to the first slits 21u, respectively, and crank-shaped sections 21w take place between the first slits 21u and the slits 21ma/21mb. The crank-shaped sections 21w connects the side sections of the outer peripheral sub-area to the central section of the outer peripheral sub-area. The crank-shaped sections 21w are conducive to the effective absorption of the thermal stress. In this instance, the cross-shaped slits 21q to 21t as a whole constitute a second slit pattern.

The slits 21f to 21i, 21q to 21t, 21ma/21mb, 21na/21nb, 21oa/21ob and 21pa/21pb are open to not only a major surface of the die pad 21a where the semiconductor chip 20 is mounted but also a reverse surface. In other words, all of the slits 21f to 21pa/21pb pass through the die pad 21a.

The first slit pattern, i.e., the slits 21f to 21i, the second slit pattern, i.e., the slits 21q to 21t and the slit groups 21ma/21mb, 21na/21nb, 21oa/21ob and 21pa/21pb at least twice intercept a thermal stress in a direction between the peripheral edges 21f and 21g or 21h and 21i opposite to each other or a thermal stress in a direction of a diagonal of the die pad 21a. Therefore, the first slit pattern, the second slit pattern and the slit groups 21ma/21mb to 21pa/21pb effectively absorb the internal stress repeatedly exerted to the die pad 21a in the heat cycle test, and prevent the plastic package 22 from cracks.

Moreover, the first slit pattern, the second slit pattern and the slit groups are arranged in symmetry, and balances the shrinkage and the elongation. This feature also prevents the plastic package 22 from cracks.

The present inventors evaluated the semiconductor device according to the present invention. Two kinds of 144-pin quad flat packages were prepared. A plurality of semiconductor chips were respectively mounted on the lead-frames 21 shown in FIG. 6, and the semiconductor chips and the lead-frames 21 were sealed in plastic resin A and plastic resin B so as to form the 144-pin quad flat packages according to the present invention. These semiconductor devices formed the first group according to the present invention.

Figure 1:
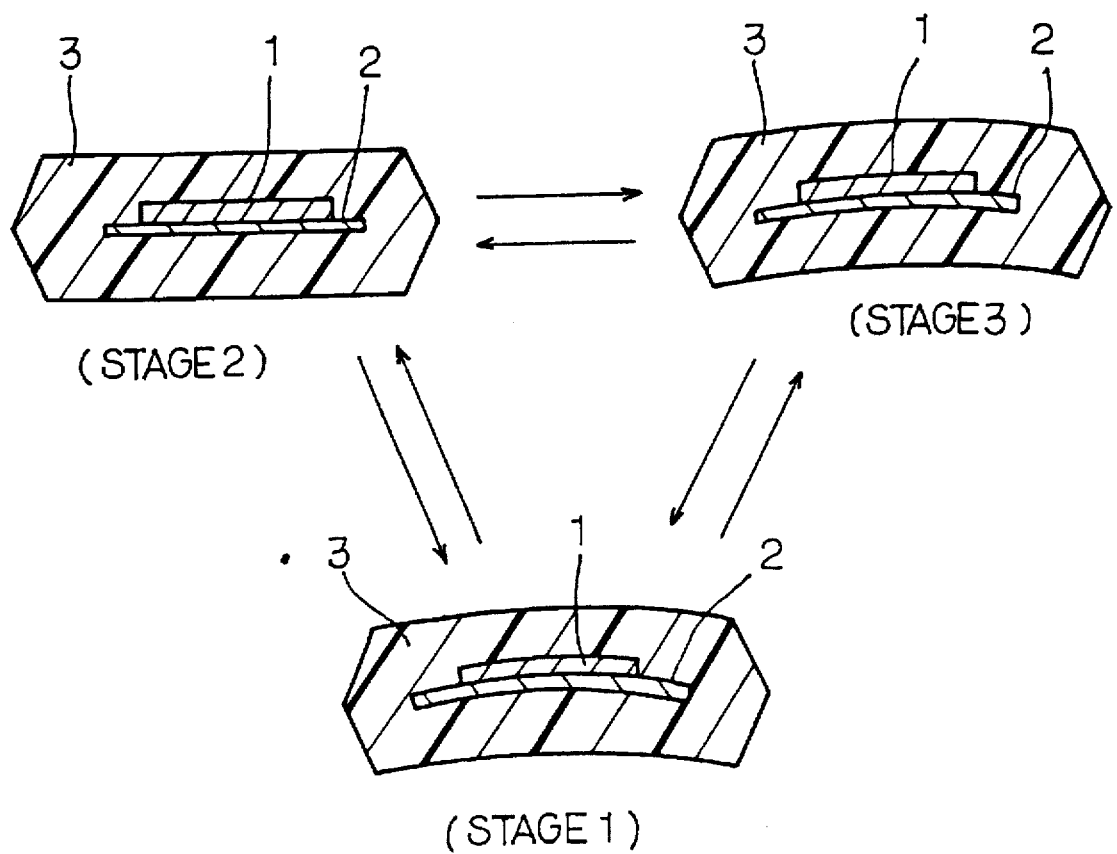
FIG. 1 is a schematic view showing the heat cycle test on the prior art semiconductor device.
Figure 2:
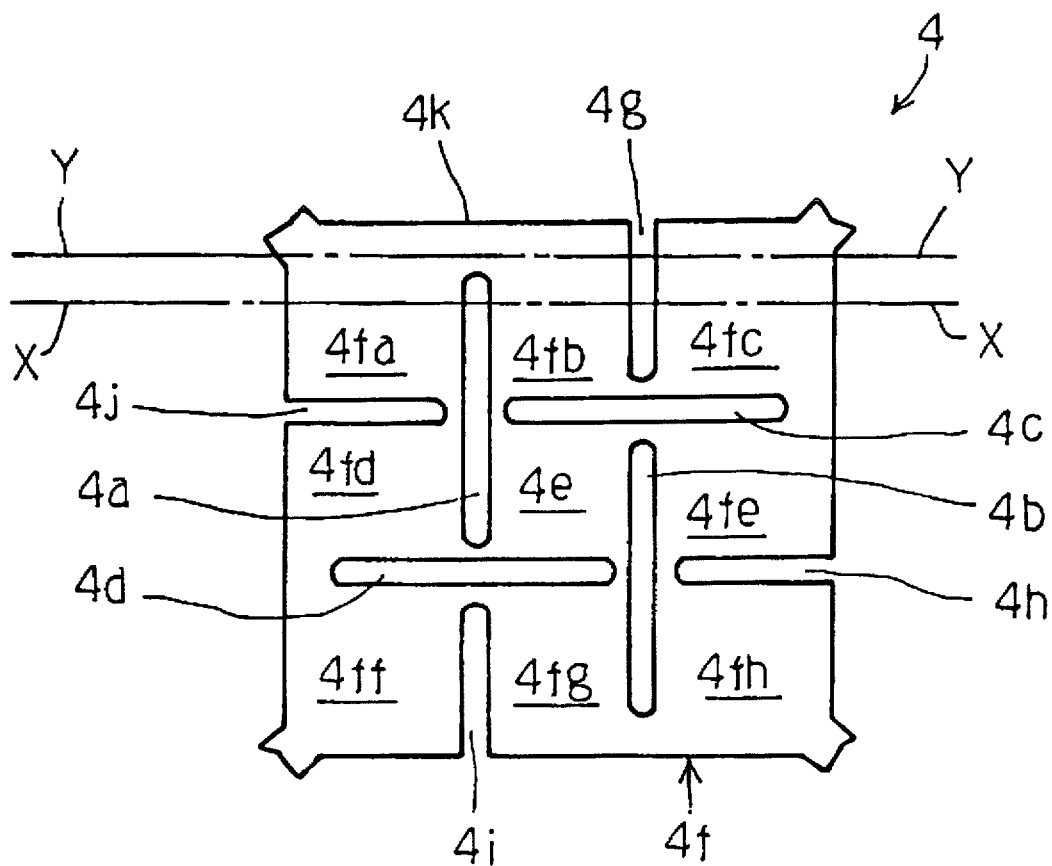
FIG. 2 is a plan view showing the tub of the prior art lead-frame.

A plurality of semiconductor chips were also mounted on the prior art lead-frames 4 shown in FIG. 2, and the semiconductor chips and the prior art lead-frames were sealed in the plastic resin A and the plastic resin B so as to form the prior art 144-pin quad flat packages. These semiconductor devices formed the second group of the prior art technology.

The first group and the second group were subjected to a test through repetition of a heat cycle from −65 degrees in centigrade through room temperature to +150 degrees in centigrade and vice versa. The heat cycle was repeated 50 times, 100 times, 170 times and 300 times, and the 144-pin quad flat packages of the first group and the 144-pin quad flat packages of the second group were observed to see whether or not cracks take place. The evaluation was summarized in Table.

TABLE

| | | Failure Ratio (cracked samples/samples) | | | |
|---|---|---|---|---|---|
| | Resin | 50 CYCs | 100 CYCs | 170 CYCs | 300 CYCs |
| 1st. group | A | 0/20 | 0/15 | 0/10 | 0/5 |
| | B | 1/20 | 0/15 | 0/10 | 0/5 |
| 2nd. group | A | 0/20 | 0/15 | 0/10 | 3/5 |
| | B | 0/20 | 0/15 | 0/10 | 2/5 |

As will be understood from Table, the lead-frame according to the present invention effectively absorbed the thermal stress, and prevented the semiconductor devices from cracks. However, the cracks took place in the prior art samples at 40 to 60 percent at 300 cycles. Thus, the lead-frame according to the present invention is effective against the cracks.

Although particular embodiments of the present invention have been shown and described, it will be obvious to those skilled in the art that various changes and modifications may be made without departing from the spirit and scope of the present invention.

For example, more than two slits may inwardly project from each of the our peripheral edges so as to divide a peripheral area into more than eight peripheral sub-areas.

What is claimed is:

1. A semiconductor device comprising:

a semiconductor chip having an electric circuit;

a supporting means including a die pad having a major surface defined by peripheral edges and mounting said semiconductor chip, a first slit pattern open to said major surface and a reverse surface of said die pad and formed in said die pad so as to divide said major surface into a central area and a peripheral area, said semiconductor chip occupying said central area and an inner peripheral sub-area of said peripheral area, and a plurality of slit groups each having a plurality of slits inwardly projecting from one of said peripheral edges through an outer peripheral sub-area of said peripheral area into said inner peripheral sub-area so as to divide a part of said outer peripheral sub-area along said one of said peripheral edges into a plurality of sections, said plurality of sections being nearly equal in length in a direction of said one of said peripheral edges, said first slit pattern and said plurality of slit groups at least twice intercepting a force in a direction of a straight line between two of said peripheral edges opposite to each other and a force in a direction of a diagonal line on said major surface; and a sealing means provided around said semiconductor chip mounted on said die pad for preventing said semiconductor chip from contaminants.

2. A semiconductor device comprising:

a semiconductor chip having an electric circuit;

a supporting means including a die pad having a major surface defined by peripheral edges and mounting said semiconductor chip, a first slit pattern open to said major surface and a reverse surface of said die pad and formed in said die pad so as to divide said major surface into a central area and a peripheral area, said semiconductor chip occupying said central area and an inner peripheral sub-area of said peripheral area, and plurality of slit groups each having a plurality of slits inwardly projecting from one of said peripheral edges through said outer peripheral sub-area into said inner peripheral sub-area so as to divide a part of said outer peripheral sub-area along said one of said peripheral edges into a plurality of sections, two slits being incorporated in each of said plurality of slit groups so as to divide said part of said outer peripheral sub-area into three sections, said first slit pattern and said plurality of slit groups at least twice intercepting a force in a direction of a straight line between two of said peripheral edges opposite to each other and a force in a direction of a diagonal line on said major surface; and a sealing means provided around said semiconductor chip mounted on said die pad for preventing said semiconductor chip from contaminants.

3. The semiconductor device as set forth in claim 2, in which said three sections are nearly equal in length in a direction of said one of said peripheral edges.

4. The semiconductor device comprising:

a semiconductor chip having an electric circuit;

a supporting means including a die pad having a major surface defined by peripheral edges and mounting said semiconductor chip, a first slit pattern open to said major surface and a reverse surface of said die pad and formed in said die pad so as to divide said major surface into a central area and a peripheral area, said semiconductor chip occupying said central area and an inner peripheral sub-area of said peripheral area, and a plurality of slit groups each having a plurality of slits inwardly projecting from one of said peripheral edges through said outer peripheral sub-area into said inner peripheral sub-area so as to divide a part of said outer peripheral sub-area alone said one of said peripheral edges into a plurality of sections, said first slit pattern and said plurality of slit groups at least twice intercepting a force in a direction of a straight line between two of said peripheral edges opposite to each other and a force in a direction of a diagonal line on said major surface;

a sealing means provided around said semiconductor chip mounted on said die pad for preventing said semiconductor chip from contaminants; and a second slit pattern open to said major surface and said reverse surface and formed in said peripheral area so that said first slit pattern, said second slit pattern and said plurality of slit groups at least twice intercept said force in said direction of said straight line and said force in said direction of said diagonal line on said major surface.

5. The semiconductor device as set forth in claim 4, in which two pairs of slits constitute said first slit pattern so as to shape said central area into a rectangular configuration, and four cross-shaped slits are provided outside four corners of said central area so as to form said second slit pattern.

6. The semiconductor device as set forth in claim 5, in which each of said cross-shaped slits has a first slit perpendicular to one of said peripheral edges and a second slit crossing said first slit and extending in parallel to said one of said peripheral edges, one of said plurality of slits projecting from said one of said peripheral edges in parallel to said first slit toward said second slit so as to form a crank-shaped section connecting adjacent two of said plurality of sections to each other.

7. Semiconductor device comprising:

a semiconductor chip having an electric circuit;

a support including a die pad having a major surface defined by peripheral edges and mounting said semiconductor chip, a first slit Pattern open to said major surface and a reverse surface of said die pad and formed in said die pad so as to divide said major surface into a central area and a peripheral area, said semiconductor chip occupying said central area and an inner peripheral sub-area of said peripheral area, and a plurality of slit groups each having a plurality of slits inwardly projecting from one of said peripheral edges through an outer peripheral sub-area of said peripheral area into said inner peripheral sub-area so as to divide a part of said outer peripheral sub-area alone said one of said peripheral edges into a plurality of sections, said plurality of sections being nearly equal in length in a direction of said one of said peripheral edges, said first slit pattern and said plurality of slit groups at least twice intercepting a force in a direction of a straight line between two of said peripheral edges opposite to each other and a force in a direction of a diagonal line on said major surface; and a sealing device provided around said semiconductor chip mounted on said die pad for preventing said semiconductor chip from contaminants.

8. A semiconductor device comprising:

a semiconductor chip having an electric circuit;

a support including a die pad having a major surface defined by peripheral edges and mounting said semiconductor chip, a first slit pattern open to said major surface and a reverse surface of said die pad and formed in said die paid so as to divide said major surface into a central area and a peripheral area, said semiconductor chip occupying said central area and an inner peripheral sub-area of said peripheral area, and a plurality of slit groups each having a plurality of slits inwardly projecting from one of said peripheral edges through said outer peripheral sub-area into said inner peripheral sub-area so as to divide a part of said outer peripheral sub-area along said one of said peripheral edges into a plurality of sections, two slits being incorporated in each of said plurality of slit groups so as to divide said part of said outer peripheral sub-area into three sections, said first slit pattern and said plurality of slit groups at least twice intercepting a force in a direction of a straight line between two of said peripheral edges opposite to each other and a force in a direction of a diagonal line on said major surface; and a sealing device provided around said semiconductor chip mounted on said die pad for preventing said semiconductor chip from contaminants.

9. A semiconductor device comprising:

a semiconductor chip having an electric circuit;

a support including a die pad having a major surface defined by peripheral edges and mounting said semiconductor chip, a first slit pattern open to said major surface and a reverse surface of said die pad and formed in said die pad so as to divide said major surface into a central area and a peripheral area, said semiconductor chip occupying said central area and an inner peripheral sub-area of said peripheral area, and a plurality of slit groups each having a plurality of slits inwardly projecting from one of said peripheral edges through said outer peripheral sub-area into said inner peripheral subarea so as to divide a part of said outer peripheral sub-area alone said one of said peripheral edges into a plurality of sections, said first slit pattern and said plurality of slit groups at least twice intercepting a force in a direction of a straight line between two of said peripheral edges opposite to each other and a force in a direction of a diagonal line on said major surface;

a sealing device provided around said semiconductor chip mounted on said die pad for preventing said semiconductor chip from contaminants; and a second slit pattern open to said major surface and said reverse surface and formed in said peripheral area so that said first slit pattern, said second slit pattern and said plurality of slit groups at least twice intercept said force in said direction of said straight line and said force in said direction of said diagonal line on said major surface.

* * * * *